United States Patent
Maruyama

(10) Patent No.: US 7,190,339 B2
(45) Date of Patent: Mar. 13, 2007

(54) FERROELECTRIC MEMORY DEVICE AND DISPLAY DRIVE IC

(75) Inventor: Akira Maruyama, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 617 days.

(21) Appl. No.: 10/752,184

(22) Filed: Jan. 7, 2004

(65) Prior Publication Data
US 2004/0208041 A1 Oct. 21, 2004

(30) Foreign Application Priority Data
Jan. 17, 2003 (JP) ............................. 2003-010152

(51) Int. Cl.
*G09G 3/36* (2006.01)
(52) U.S. Cl. ......................... 345/97; 365/145
(58) Field of Classification Search ................. 345/97; 257/202, 207, 208, 295, 296; 365/145, 200
See application file for complete search history.

(56) References Cited

U.S. PATENT DOCUMENTS

| | | | | |
|---|---|---|---|---|
| 6,111,777 A * | 8/2000 | Ogiwara et al. | ............ | 365/145 |
| 6,873,537 B2 * | 3/2005 | Kang | .......................... | 365/145 |
| 6,920,060 B2 * | 7/2005 | Chow et al. | ................. | 365/145 |
| 6,972,983 B2 * | 12/2005 | Roehr et al. | ................. | 365/145 |
| 2003/0223266 A1 | 12/2003 | Yamamura | | |
| 2004/0047173 A1 * | 3/2004 | Kang | .......................... | 365/145 |

FOREIGN PATENT DOCUMENTS

| JP | A 06-103753 | 4/1994 |
|---|---|---|
| JP | A 9-116107 | 5/1997 |
| JP | A 2000-156078 | 6/2000 |

OTHER PUBLICATIONS

U.S. Appl. No. 10/754,691, filed Jan. 12, 2004, Murayama.
U.S. Appl. No. 10/758,179, filed Jan. 13, 2004, Yamamura.
U.S. Appl. No. 10/747,395, filed Dec. 30, 2003, Maruyama.
U.S. Appl. No. 10/747,523, filed Dec. 30, 2003, Maruyama.
U.S. Appl. No. 10/737,959, filed Dec. 18, 2003, Maruyama.

* cited by examiner

*Primary Examiner*—Nitin Patel
(74) *Attorney, Agent, or Firm*—Oliff & Berridge, PLC

(57) ABSTRACT

A ferroelectric memory device capable of structurally reducing data deterioration. In this ferroelectric memory device, bitlines are hierarchized, and sub-bitlines subordinate to the bitlines through sub-bitline select switches are provided in each of a plurality of block regions. The block regions are sequentially selected along an increment direction, and wordlines in each block are sequentially selected along the increment direction from the lowest wordline to the highest wordline. The number "n" of wordlines arranged in each block region is set equal to or less than a predetermined limit number about relaxation.

14 Claims, 10 Drawing Sheets

R: READ (WRITING OF DATA "0")
RW: REWRITE (WRITING OF DATA "1")

W: WRITE (WRITING OF DATA "1")
R: READ (WRITING OF DATA "0")

FERROELECTRIC MEMORY DEVICE AND DISPLAY DRIVE IC

Japanese Patent Application No. 2003-10152 filed on Jan. 17, 2003, is hereby incorporated by reference in its entirety.

BACKGROUND OF THE INVENTION

The present invention relates to a ferroelectric memory device and a display driver IC.

As a ferroelectric memory device, an active ferroelectric memory device including 1T/1C cells in which one transistor and one ferroelectric capacitor are disposed in each memory cell, or including 2T/2C cells in which a reference cell is further disposed in each memory cell, has been known.

However, since the active ferroelectric memory device has a large memory area in comparison with a flash memory or EEPROM which is known as a nonvolatile memory device in which a memory cell is formed by one element, the capacity cannot be increased.

Japanese Patent Application Laid-open No. 9-116107 discloses a ferroelectric memory device in which each memory cell is formed by one ferroelectric capacitor.

BRIEF SUMMARY OF THE INVENTION

However, problems which must be solved before practical use remain for the ferroelectric memory device in which each memory cell is formed by one ferroelectric capacitor, such as problems relating to relaxation and an increase in drive speed. An objective of the present invention is to solve these problems.

According to a first aspect of the present invention, there is provided a ferroelectric memory device comprising:
a memory cell array region divided into a plurality of block regions;
a plurality of wordlines arranged in parallel along a first direction within the memory cell array region;
a plurality of bitlines arranged in parallel along a second direction intersecting the first direction, within the memory cell array region;
a plurality of sub-bitlines provided for each of the bitlines in each of the block regions;
a sub-bitline select switch provided between each of the sub-bitlines and corresponding one of the bitlines;
a plurality of ferroelectric memory cells respectively disposed at intersections between the sub-bitlines and the wordlines;
a first driver section which drives the wordlines and the sub-bitline select switches; and
a second driver section which drives the bitlines,
wherein the first driver section selects one of the wordlines sequentially in the second direction, and turns on the sub-bitline select switches connected to the sub-bitlines intersecting the selected one of the wordlines; and
wherein the number of the wordlines in each of the block regions is set equal to or less than a predetermined limit number of times for preventing excessive relaxation of the ferroelectric memory cells.

According to the first aspect of the invention, the block regions are sequentially selected in the second direction, and the wordlines are sequentially selected in each of the block regions while being incremented from the lowest wordline to the highest wordline. This is a read cycle. If the number of wordlines in each of the block regions is "n", the select operation is repeatedly performed "n" times in each of the block regions within one cycle. In one ferroelectric memory cell in one block region, data is read from the ferroelectric memory cell only once among the n times, and an unselected voltage is applied to the ferroelectric memory cell the remaining (n−1) times. The number of times the unselected voltage is applied is thus limited based on the number "n" of the wordlines in one block region. The number "n" is set equal to or less than the predetermined limit number about relaxation. Therefore, excessive deterioration of data can be prevented when reading the data from the ferroelectric memory cells.

The first aspect of the present invention can also be applied to a ferroelectric memory device in which the bitlines are not hierarchized. This ferroelectric memory device according to a second aspect of the present invention comprises:
a plurality of memory cell array regions;
a plurality of wordlines arranged in parallel along a first direction within each of the memory cell array regions;
a plurality of bitlines arranged in parallel along a second direction intersecting the first direction, within each of the memory cell array regions;
a plurality of ferroelectric memory cells respectively disposed at intersections between the wordlines and the bitlines within each of the memory cell array regions;
a first driver section which drives the wordlines within each of the memory cell array regions; and
a second driver section which drives the bitlines within each of the memory cell array regions,
wherein the memory cell array regions are arranged along the second direction, and the first driver section selects one of the wordlines sequentially in the second direction within each of the memory cell array regions; and
wherein the number of the wordlines within each of the memory cell array regions is set equal to or less than a predetermined limit number of times for preventing excessive relaxation of the ferroelectric memory cells.

In both cases, the predetermined limit number may be a maximum number of times an unselected voltage is allowed to be applied when logic of data deteriorated by the repeated application of the unselected voltage with the same polarity to the ferroelectric memory cells, is determined to be the same as the logic of the original data before deterioration by a sense amplifier connected to the bitlines when reading the data. This prevents the stored data from being erroneously determined.

According to a third aspect of the present invention, there is provided a ferroelectric memory device comprising:
a first memory cell array;
a second memory cell array; and
a data buffer which writes data read from the first memory cell array into the second memory cell array,
wherein each of the first and second memory cell arrays includes:
a plurality of wordlines arranged in parallel along a first direction and sequentially selected in a second direction which intersects the first direction;
a plurality of bitlines arranged in parallel along the second direction and connected to the data buffer; and
a plurality of ferroelectric memory cells respectively disposed at intersections between the wordlines and the bitlines.

Each of data reading from the ferroelectric memory cell and data writing into the ferroelectric memory cell requires a step of writing a first logical value which is one of two values, and a step of writing a second logical value which is the other of the two values, as described later in detail. In this aspect of the invention, a step of reading data from the first memory cell array corresponds to the step of writing the first logical value, and a step of writing the data read from the first memory cell array into the second memory cell array corresponds to the step of writing the second logical value. The access time can be thus halved in comparison with the case of performing the two steps for the first memory cell array by separately using the first and second memory cell arrays in the two steps.

In more detail, at least one of the ferroelectric memory cells connected to one of the wordlines within the first memory cell array may be set into a state in which a first logical value is written by reading one of the first logical value and a second logical value stored in the at least one of the ferroelectric memory cells. The second logical value read from the first memory cell array may be written into at least one of the ferroelectric memory cells connected to one of the wordlines within the second memory cell array, the first logical value being previously stored in the at least one of the ferroelectric memory cells.

After that, the data buffer may write data read from the second memory cell array into the first memory cell array. The memory cell array from which the data is read can be alternately changed between the first and second memory cell arrays. In this case, at least one of the ferroelectric memory cells connected to one of the wordlines within one of the first and second memory cell arrays may be set into a state in which a first logical value is written by reading one of the first logical value and a second logical value stored in the at least one of the ferroelectric memory cells. The second logical value read from one of the first and second memory cell arrays may be written into at least one of the ferroelectric memory cells connected to one of the wordlines within the other of the first and second memory cell arrays, the first logical value being previously stored in the at least one of the ferroelectric memory cells.

The ferroelectric memory device according to the third aspect of the invention may further comprise a third memory cell array which includes a plurality of wordlines, a plurality of bitlines, and a plurality of ferroelectric memory cells. In this case, the data buffer may write data which has been read from the second memory cell array into the third memory cell array, and write data which has been read from the third memory cell array into the first memory cell array.

In order to perform the above operation, at least one of the ferroelectric memory cells connected to one of the wordlines within one of the first to third memory cell arrays may be set into a state in which a first logical value is written by reading one of the first logical value and a second logical value stored in the at least one of the ferroelectric memory cells. The second logical value read from one of the first to third memory cell arrays may be written into at least one of the ferroelectric memory cells connected to one of the wordlines within another one of the first to third memory cell arrays, the first logical value is previously stored in the at least one of the ferroelectric memory cells.

As the memory cell array used in the third aspect of the invention, the memory cell array used in the first aspect of the invention may be used. This ensures high-speed access and prevents deterioration of data.

According to a fourth aspect of the present invention, there is provided a display driver IC comprising: the above-described ferroelectric memory device; and a driver section which is driven based on data read from the ferroelectric memory device. With this display driver IC, data can be read in synchronization with the display cycle, and the image quality can be improved.

DETAILED DESCRIPTION OF THE EMBODIMENT

First Embodiment

Figure 1:
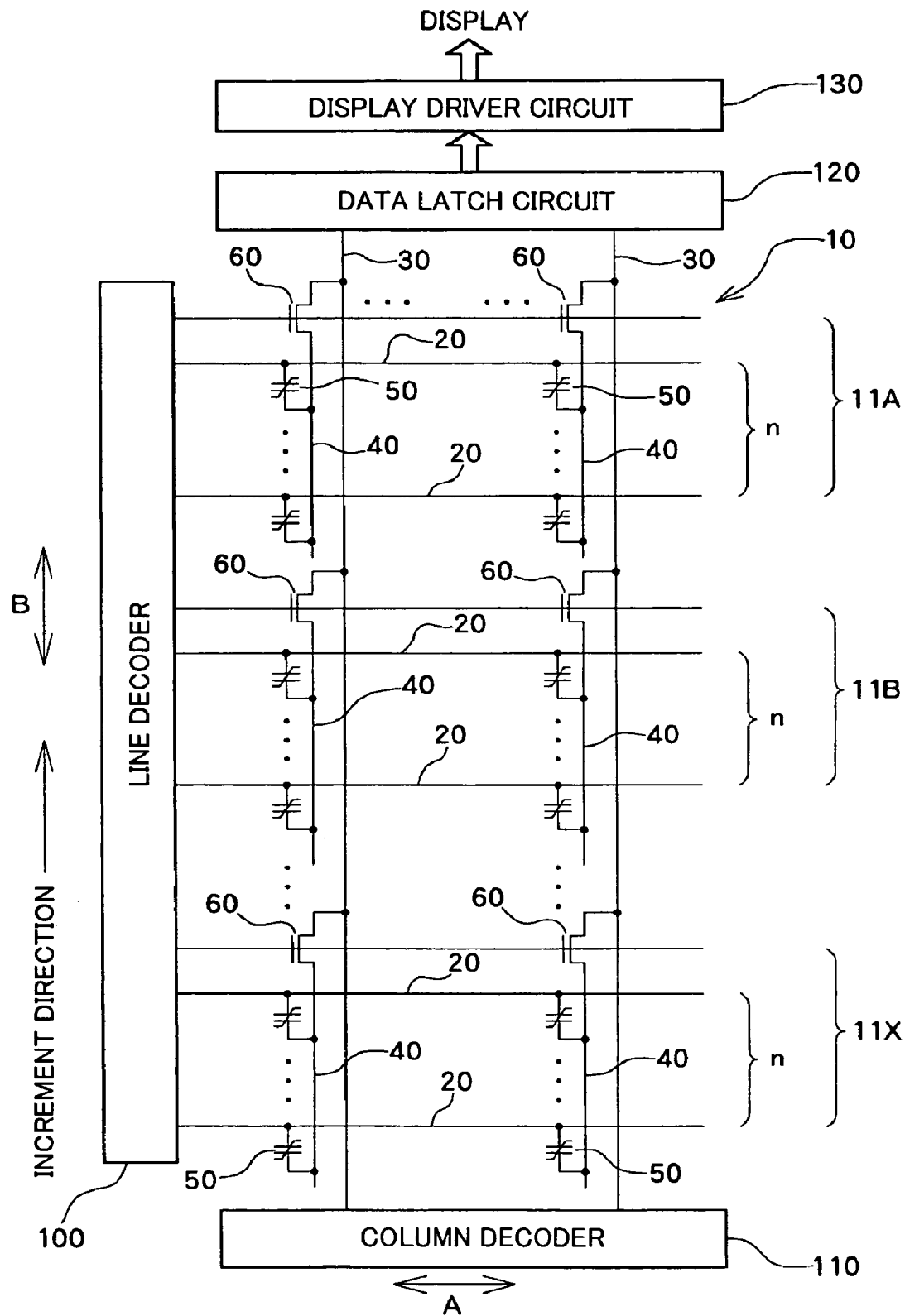
FIG. 1 is a diagram schematically showing a ferroelectric memory device according to a first embodiment of the present invention.

FIG. 1 shows a first embodiment of the present invention. In a memory cell array region 10 shown in FIG. 1, a row direction A in which wordlines 20 extend is defined as a first direction, and a column direction B in which hierarchized main bitlines 30 and sub-bitlines 40 extend is defined as a second direction. However, the present invention is not limited thereto. The memory cell array region 10 shown in FIG. 1 is divided into a plurality of row blocks 11A, 11B, . . . and 11X at least in the column direction B.

A line decoder 100 and a column decoder 110 which drive the memory cell array 10 are provided. Data read from the memory cell array 10 is sent to a display driver circuit 130 through a data latch circuit 120. A ferroelectric memory device of the present embodiment may be mounted on a display driver IC together with the display driver circuit 130 and used to drive a liquid crystal display or the like.

Memory Cell Array Region

The memory cell array region 10 is described below. In the present embodiment, at least the bitlines 30 are hierarchized. Specifically, the sub-bitlines 40 are provided for each of the main bitlines 30 in each of the row blocks 11A, 11B, . . . and 11X. In the present embodiment, the wordlines 20 may be hierarchized.

Ferroelectric capacitors (memory cells) 50 are formed at intersecting points of the sub-bitlines 40 subordinate to each of the main bitlines 30 and the wordlines 20.

A plurality of sub-bitline select switches 60 are provided between each of the main bitlines 30 and one end of each of the sub-bitlines 40.

The number of wordlines 20 disposed in each of the row blocks 11A, 11B, . . . and 11X is set at n. In the case where the wordlines 20 are hierarchized and sub-wordlines are disposed in each of the row blocks, the number of sub-wordlines in each of the row blocks is set at n.

Peripheral Circuit of Memory Cell Array

The line decoder 100, the column decoder 110, and the data latch circuit 120 shown in FIG. 1 read data from the memory cell array 10, and send the data to the display driver circuit 130 which drives a display such as a liquid crystal display.

When reading data, the column decoder 110 supplies a selected bit voltage to all the main bitlines 30, and reads data from the ferroelectric capacitors 50 disposed on one line at the same time through all the main bitlines 30.

The line decoder 100 shown in FIG. 1 sequentially selects the wordlines 20 in an increment direction shown in FIG. 1. The line decoder 100 selects one of the wordlines 20 by supplying a selected word voltage while supplying an unselected word voltage to the remaining wordlines 20 to allow these wordlines 20 to be unselected. The line decoder 100 turns ON the sub-bitline select switches 60 connected with the sub-bitlines 40 which intersect one of the wordlines 20 selected each time. Specifically, the line decoder 100 selects the block region 11X, and turns ON the sub-bitline select switches 60 disposed in the row block 11X. The line decoder 100 sequentially selects the wordlines 20 in the row block 11X along the increment direction in the order from the wordline 20 at the bottom in FIG. 1. After all the wordlines 20 in the row block 11X have been selected, the line decoder 100 sequentially selects the wordlines 20 in the next row block adjacent to the row block 11X in the second direction B in the same manner as described above. Finally, the line decoder 100 selects the wordlines 20 in the row block 11A located on the upper end. One cycle of reading of data is thus completed, and the next cycle of reading is performed in the same manner as described above.

Operation

This ferroelectric memory device is a memory device which utilizes two polarization states which appear in a hysteresis phenomenon of the ferroelectric capacitor 50 as one bit.

Figure 2:
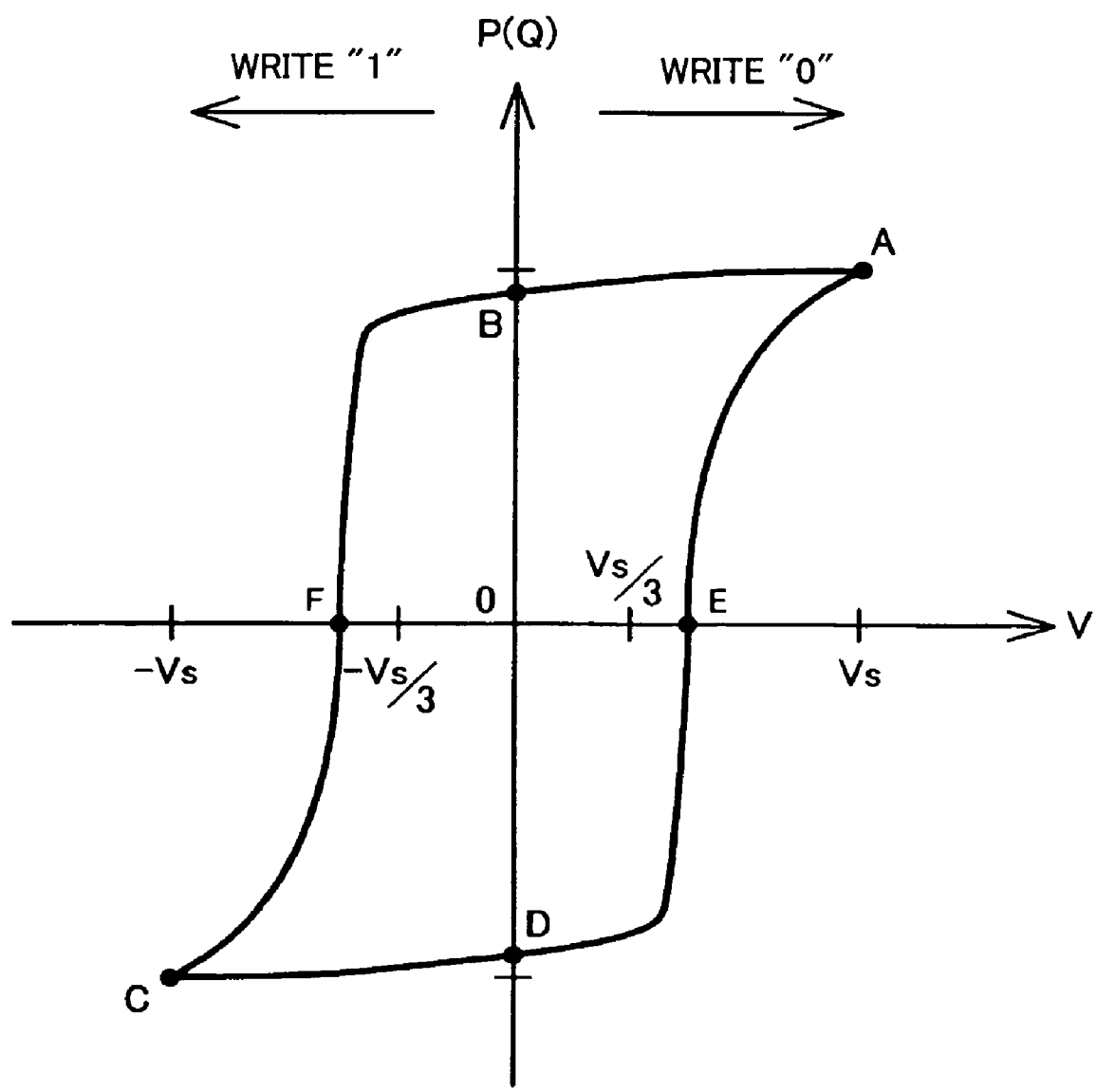
FIG. 2 is a characteristic diagram showing a hysteresis phenomenon of a ferroelectric.

The hysteresis phenomenon is described below with reference to FIG. 2, which shows the correlation between voltage applied to a ferroelectric and polarization of the ferroelectric. In FIG. 2, the vertical axis P (Q) indicates the polarization (amount of charge) of the ferroelectric, and the horizontal axis V indicates the voltage applied to the ferroelectric. The curve illustrated in FIG. 2 shows characteristics in which the polarization state of the ferroelectric capacitor 50 cycles depending on the change in the voltage applied to the ferroelectric capacitor 50. For example, when a select voltage Vs is applied to the ferroelectric capacitor 50 which is in a state at a point B (memory state of logical value "0") or a state at a point D (memory state of logical value "1"), the polarization state transitions to a point A (reading of logical value "0" or "1"). When the applied voltage is changed to 0, the polarization state transitions to the point B. Specifically, the polarization state which is originally at the point D also transitions to the point B through the point A. When a select voltage −Vs is then applied to the ferroelectric capacitor 50, the polarization state transitions to a point C (writing of logical value "1"). When the applied voltage is changed to 0, the polarization state transitions to the point D (memory state of logical value "1").

An unselected voltage ($\pm Vs/3$) is applied to the ferroelectric capacitor 30 which is in a polarization state at the point B or the point D. When the applied voltage is changed to 0, the polarization state returns to the original point B or point D. This shows that the memory state is maintained even if the unselected voltage ($\pm Vs/3$) is applied to the unselected ferroelectric capacitors 50 in a period in which one of the ferroelectric capacitors 50 is selected.

Figure 3:
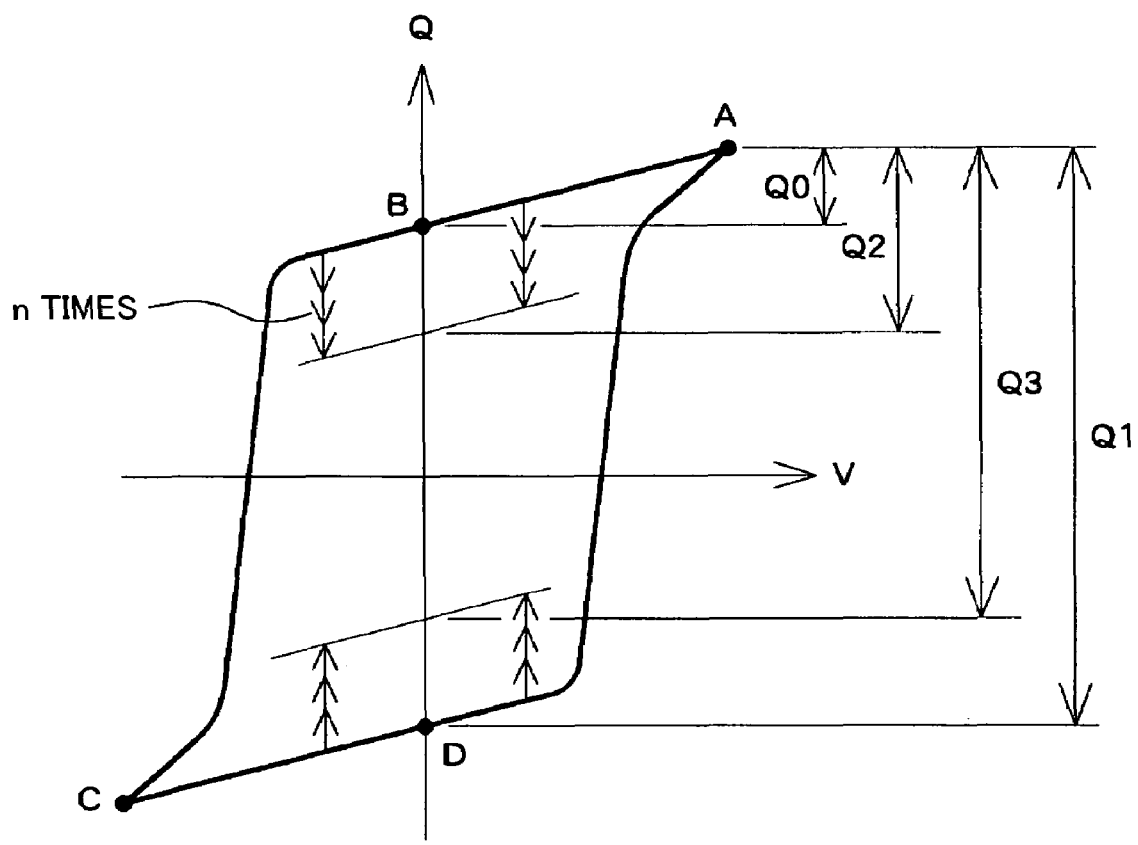
FIG. 3 is a characteristic diagram for illustrating relaxation.

However, if the unselected voltage and 0 V are alternately applied to the ferroelectric capacitor 50 which is in a polarization state at the point B or the point D, and the unselected voltage of the same polarity of either positive or negative is repeatedly applied each time, a harmful effect as shown in FIG. 3 occurs. FIG. 3 schematically shows the problem of relaxation in which the hysteresis loop of the ferroelectric capacitor 50 becomes small. Specifically, in the case where the above voltage is repeatedly applied to the ferroelectric capacitor 50, the polarization at the B point or the point D shown in FIG. 3 gradually decreases each time the voltage is applied.

The above voltage is applied to the unselected memory cells on lines differing from the selected memory cell to which the selected word voltage and the selected bit voltage are applied when the row block 11A shown in FIG. 1 is selected, for example. Since the above voltage is not repeatedly applied to the unselected row blocks, the harmful effect shown in FIG. 3 does not occur.

In a random access memory, the memory cells are selected at random. However, in the case of selecting the memory cells by using the above-described increment method, the number of times the above voltage is repeatedly applied can be limited by limiting the number of times the memory cells are continuously accessed in one row block.

In the present embodiment, the number of wordlines 20 disposed in each of the row blocks 11A, 11B, . . . and 11X is set at "n", and "n" is limited to a number (or a limit number about relaxation) at which the excessive relaxation can be prevented. The limit number about relaxation differs depending on the hysteresis characteristics of the ferroelectric capacitor to be used. Therefore, it is preferable to calculate the limit number about relaxation by actual measurement. As an example, in the case where the lower limit is determined taking into consideration reduction of the number of sub-bitline select switches 60, "n" may be set at 16 to 64.

The limit number about relaxation "n" may be a maximum number of times an unselected voltage is allowed to be applied when logic of data deteriorated by the repeated application of the unselected voltage to the ferroelectric memory cell 50, is determined to be the same as the logic of the original stored data by a sense amplifier connected to the main bitline when reading the data.

As shown in FIG. 3, the logical value 0 at the point B and the logical value 1 at the point D are judged by using the sense amplifier based on the amounts of charge Q0 and Q1 when the state transitions to the point A from the point B and the point D during reading, respectively. As shown in FIG. 3, as a result of relaxation, the original amounts of charge Q0 and Q1 are respectively reduced to the amounts of charge Q2 and Q3 after deterioration of the data. The amounts of charge Q2 and Q3 are marginal amounts which allow the logical values 0 and 1 to be distinguishably judged. In this case, the number of times "n" the unselected voltage is repeatedly applied until the amounts of charge reach the amounts of charge Q2 and Q3 is the maximum number of wordlines 20 which can be disposed in the row block.

This ensures that the unselected voltage is not continuously applied to the unselected memory cells a number of times exceeding the limit number about relaxation "n", even if the wordlines 20 are sequentially selected in the row block. Therefore, occurrence of a problem in which the data is recognized erroneously can be prevented.

Second Embodiment

Figure 4:
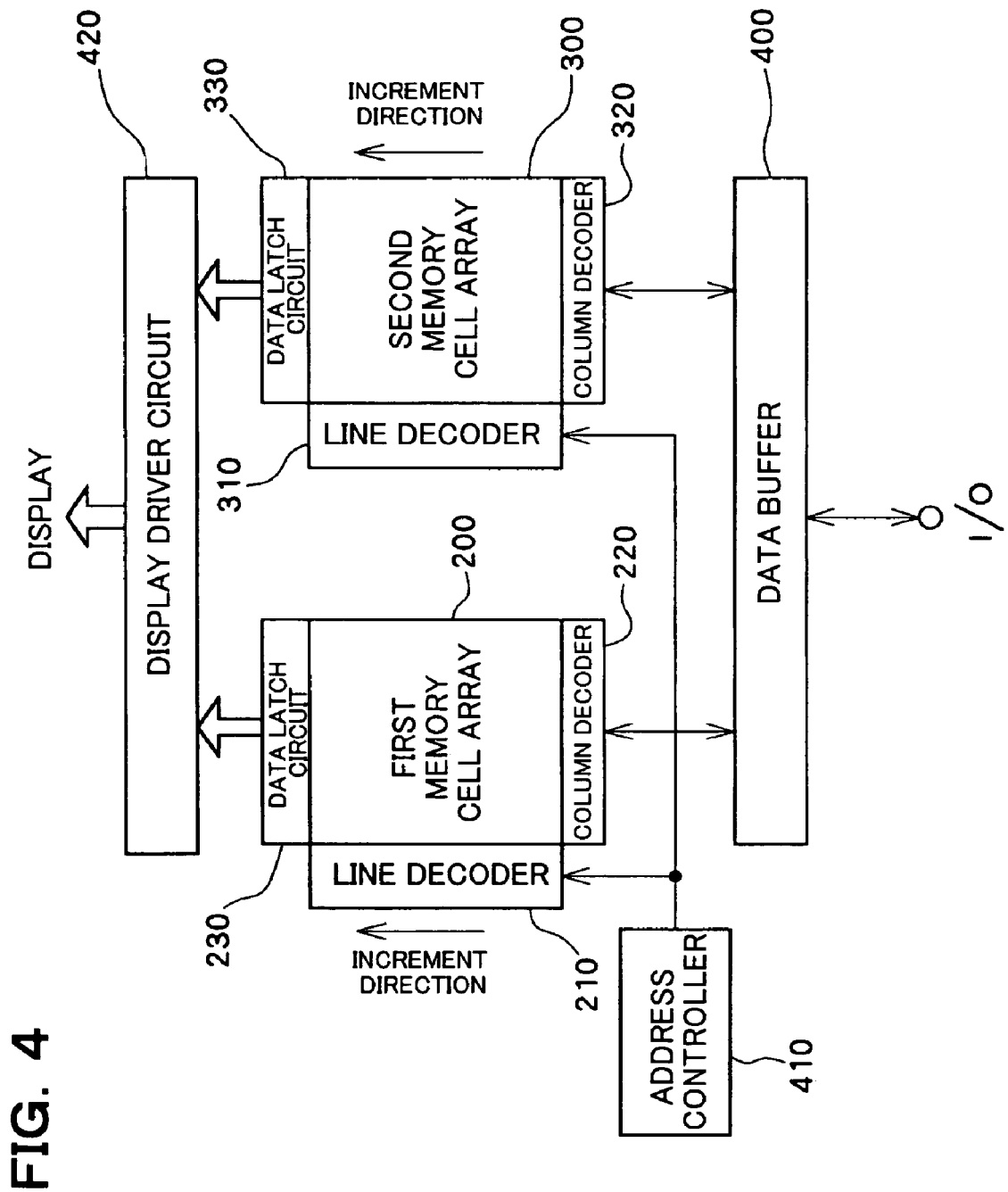
FIG. 4 is a diagram schematically showing a ferroelectric memory device according to a second embodiment of the present invention.

FIG. 4 is a diagram schematically showing a ferroelectric memory device according to a second embodiment of the present invention. The ferroelectric memory device shown in FIG. 4 includes a first memory cell array 200 and a second memory cell array 300. The first and second memory cell arrays 200 and 300 have the same structure as the memory cell array 10 shown in FIG. 1, for example. A line decoder 210, a column decoder 220, and a data latch circuit 230 are provided as peripheral circuits of the first memory cell array 200. A line decoder 310, a column decoder 320, and, a data latch circuit 330 are provided as peripheral circuits of the second memory cell array 300.

The column decoders 210 and 320 are connected with a data buffer 400. Data is input to or output from the data buffer 400 through an input/output terminal I/O.

Figure 5:
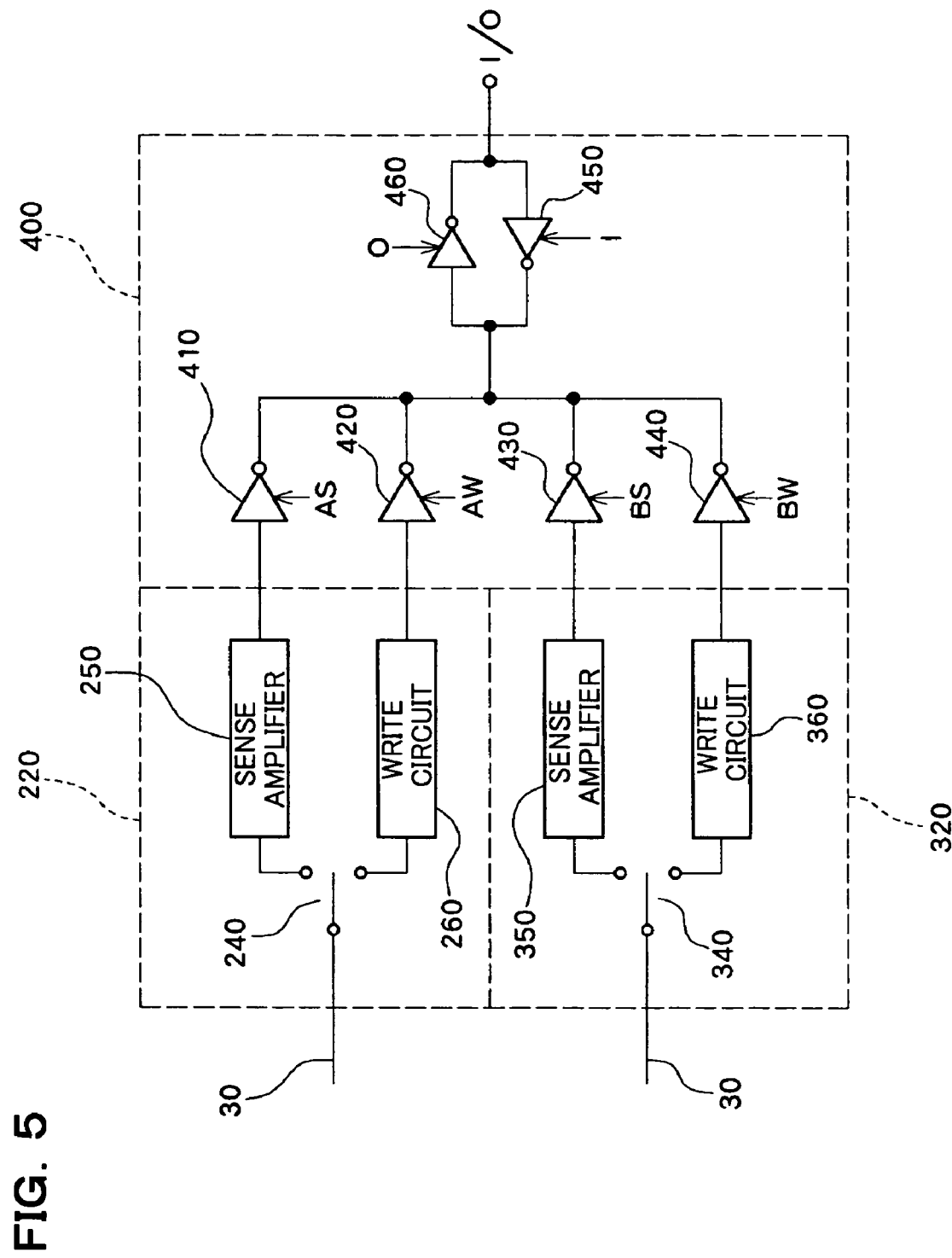
FIG. 5 is a circuit diagram showing a part of a column decoder and a data buffer shown in FIG. 4.

FIG. 5 shows a part of the column decoders 220 and 320 and the data buffer 400. In FIG. 5, a sense amplifier 250 and a write circuit 260, which are selectively connected with one of the main bitlines 30 of the first memory cell array 200 through a switch 240, are illustrated. The sense amplifier 250 and the write circuit 260 are provided in the column decoder 220. A sense amplifier 350 and a write circuit 360, which are selectively connected with one of the main bitlines 30 of the second memory cell array 300 through a switch 340, are illustrated. The sense amplifier 350 and the write circuit 360 are provided in the column decoder 320. The data buffer 400 shown in FIG. 5 includes gate circuits 410 to 460 as connection means.

The data buffer 400 controls rewriting of data read from the first memory cell array 200 along the increment direction shown in FIG. 1 in line units into one line of the second memory cell array 300 through the switch 240, the sense amplifier 250, the gate circuits 410 and 440, the write circuit 360, and the switch 340. The data buffer 400 controls rewriting of data read from the second memory cell array 300 along the increment direction shown in FIG. 1 in line units into one line of the first memory cell array 200 through the switch 340, the sense amplifier 350, the gate circuits 430 and 420, the write circuit 260, and the switch 240. The gate circuits 450 and 460 are turned ON corresponding to the input/output through the input/output terminal I/O.

When data is read from one of the first and second memory cell arrays 200 and 300, the other is used as a rewrite memory. Specifically, the memory cell arrays 200 and 300 store display data for one frame. The first and second memory cell arrays 200 and 300 are used as a memory for one frame. However, since a cross-point memory having a small area in which one memory cell is formed by one ferroelectric capacitor is used, an increase in the area of the memory cell array is minimized.

An address controller 410 which sequentially designates the line addresses (row addresses) of the first and second memory cell arrays 200 and 300 is provided for rewriting data in synchronization with reading of data.

The data latch circuits 230 and 330 are connected with a display driver circuit 420 which drives a display such as a liquid crystal display.

Operation

As described with reference to FIG. 2, the polarization directions (positive potential and negative potential) of the ferroelectric capacitor 50 can be respectively considered as the logical values "0" and "1". In the present specification, the polarization at the point B shown in FIG. 2 is defined as the logical value "0", and the polarization at the point D shown in FIG. 2 is defined as the logical value "1". In the case of storing the logical value "0" in the ferroelectric capacitor 50, the voltage Vs is applied to the ferroelectric capacitor 50. In the case of storing the logical value "1" in the ferroelectric capacitor 50, the voltage −Vs is applied to the ferroelectric capacitor 50.

Reading and writing of data of the ferroelectric memory device are described below. Writing of data "0" and writing of data "1" are necessary when writing data. Since the direction of the applied voltage must be reversed when writing data "0" and writing data "1" because of the characteristics of the ferroelectric capacitor 50, a step of writing data "0" and a step of writing data "1" are necessary.

Since this ferroelectric memory device is a destructive read type ferroelectric memory device, a rewrite operation is necessary after reading data. Therefore, a read step and a rewrite step are necessary when reading data. In the first read step, a state retained in the ferroelectric capacitor 30 is read from the amount of charge transfer in the ferroelectric capacitor 30 by applying the voltage Vs in the same direction as the direction when writing data "0". In the subsequent rewrite step, data "1" is rewritten into only the cells which have originally stored data "1" by applying the select voltage −Vs.

As described above, both writing of data "0" and writing of data "1" are necessary when reading data and writing data. This is characteristic of the ferroelectric memory device, and gives rise to a problem in which the access speed is decreased in comparison with that of the SRAM and DRAM.

The present embodiment aims at increasing the access speed by allowing the step of writing of data "0" and the step of writing of data "1" to be completed within a period of time required for one step. Therefore, the first and second memory cell arrays 200 and 300 are separately used for read and rewrite.

Figure 6:
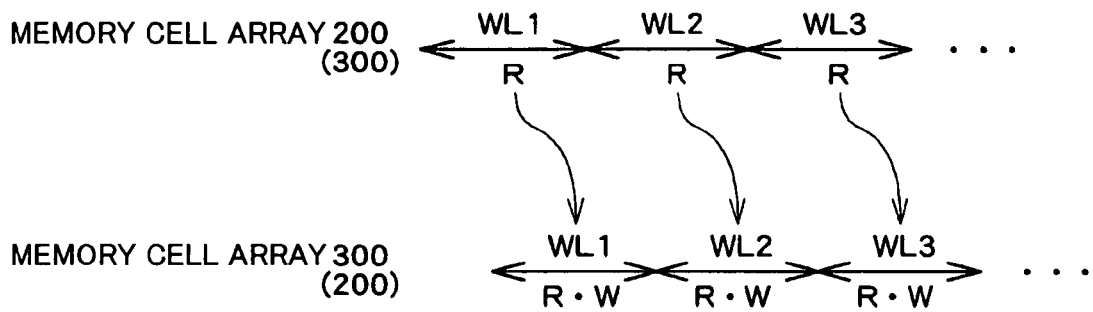
FIG. 6 is a diagram illustrative of a read sequence of the ferroelectric memory device shown in FIG. 4.

A specific example of this operation is described below with reference to FIG. 6. FIG. 6 shows an example in which data is read from the first memory cell array 200 along the increment direction. WL1, WL2, . . . shown in FIG. 6 indicate the wordlines to be selected while being sequentially incremented from the lowest wordline. Specifically, the wordlines are selected in the order of the wordlines WL1, WL2, . . . in the first memory cell array 200. Therefore, data is read from the ferroelectric capacitors 50 connected with the wordlines 20 shown in FIG. 1 through the sub-bitlines 40, the sub-bitline select switches 60, and the main bitlines 30.

In this data read step, the polarization state is allowed to transition to the point A from the point B or the point D shown in FIG. 2 by applying the select voltage Vs to the ferroelectric capacitor 50. Therefore, this data read step corresponds to writing of data "0" as described above. When the applied voltage is changed to 0 V, the ferroelectric capacitor is in a memory state of the logical value "0" at the point B. Therefore, data in the memory cell which has originally stored the logical value "1" at the point D shown in FIG. 2 is destroyed. This makes it necessary to rewrite the logical value "1" into the memory cell which has stored the logical value "1" by applying the selected voltage −Vs as shown in FIG. 2.

In the present embodiment, the step of rewriting the logical value "1" is performed for the second memory cell array 300 instead of the first memory cell array 200. As a prerequisite, the data "0" must be written in advance in all the memory cells of the second memory cell array 300 on one line in which the rewrite step of the logical value "1" is performed. This can be achieved by reading the data from all the memory cells on the line.

As shown in FIG. 6, the wordline WL1 of the second memory cell array 300 is selected during a period in which the data is read from all the memory cells on the wordline WL1 of the first memory cell array 200. The logical value "1" is rewritten into the memory cell at an address (address on the wordline WL1 of the second memory cell array 300) corresponding to the memory cell which has stored the logical value "1" among the memory cells on the wordline WL1 of the first memory cell array 200. Since the data "0" has been written in advance in the memory cells at other addresses on the wordline WL1 of the second memory cell array 300, the write operation is unnecessary.

The data of each of the memory cells on the wordline WL1 of the first memory cell array 200 is transferred to each of the memory cells on the wordline WL1 of the second memory cell array 300. Subsequently, the read operation is performed by sequentially selecting each of the wordlines of the first memory cell array 200, and the rewrite operation is performed by sequentially selecting each of the wordlines of the second memory cell array 300. After the data for one frame is read from the first memory cell array 200, data is read from the second memory cell array 300 in the same manner as described above. In this case, the first memory cell array 200 is used as a rewrite memory.

Figure 7:
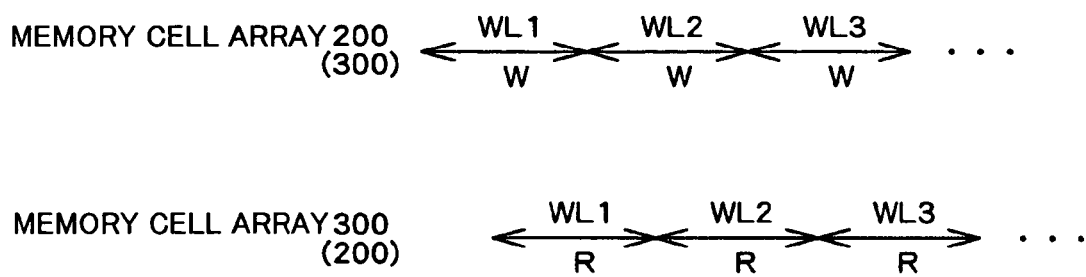
FIG. 7 is a diagram illustrative of a write sequence of the ferroelectric memory device shown in FIG. 4.

FIG. 7 shows an operation of writing new data into the first memory cell array 200. New data is written through the input/output terminal I/O, the data buffer 400, and the column decoder 220. FIG. 7 shows an example in which data is written while selecting the wordlines in the order of the wordlines WL1, WL2, . . . However, the present invention is not limited thereto. The data may be written while randomly selecting a line for which rewrite is necessary.

In the case of writing new data into the memory cell connected with the wordline WL1 of the first memory cell array 200, the data must be read from the memory cells connected with the wordline WL1 of the second memory cell array 300. This allows the data "0" to be written in the memory cells connected with the wordline WL1 of the second memory cell array 300.

This operation is necessary for preparing to read new data from the memory cells connected with the wordline WL1 of the first memory cell array 200 as shown in FIG. 6. New data having a logical value "1" must be rewritten into the memory cells connected with the wordline WL1 of the second memory cell array 300 when reading the new data. Therefore, data "0" must be written into the memory cells connected with the wordline WL1 of the second memory cell array 300 before rewriting the logical value "1". Therefore, when writing new data into one of the first and second memory cell arrays 200 and 300, data is read from the other of the first and second memory cell arrays 200 and 300. The new data may be rewritten by utilizing a non-display period, for example.

Third Embodiment

Figure 8:
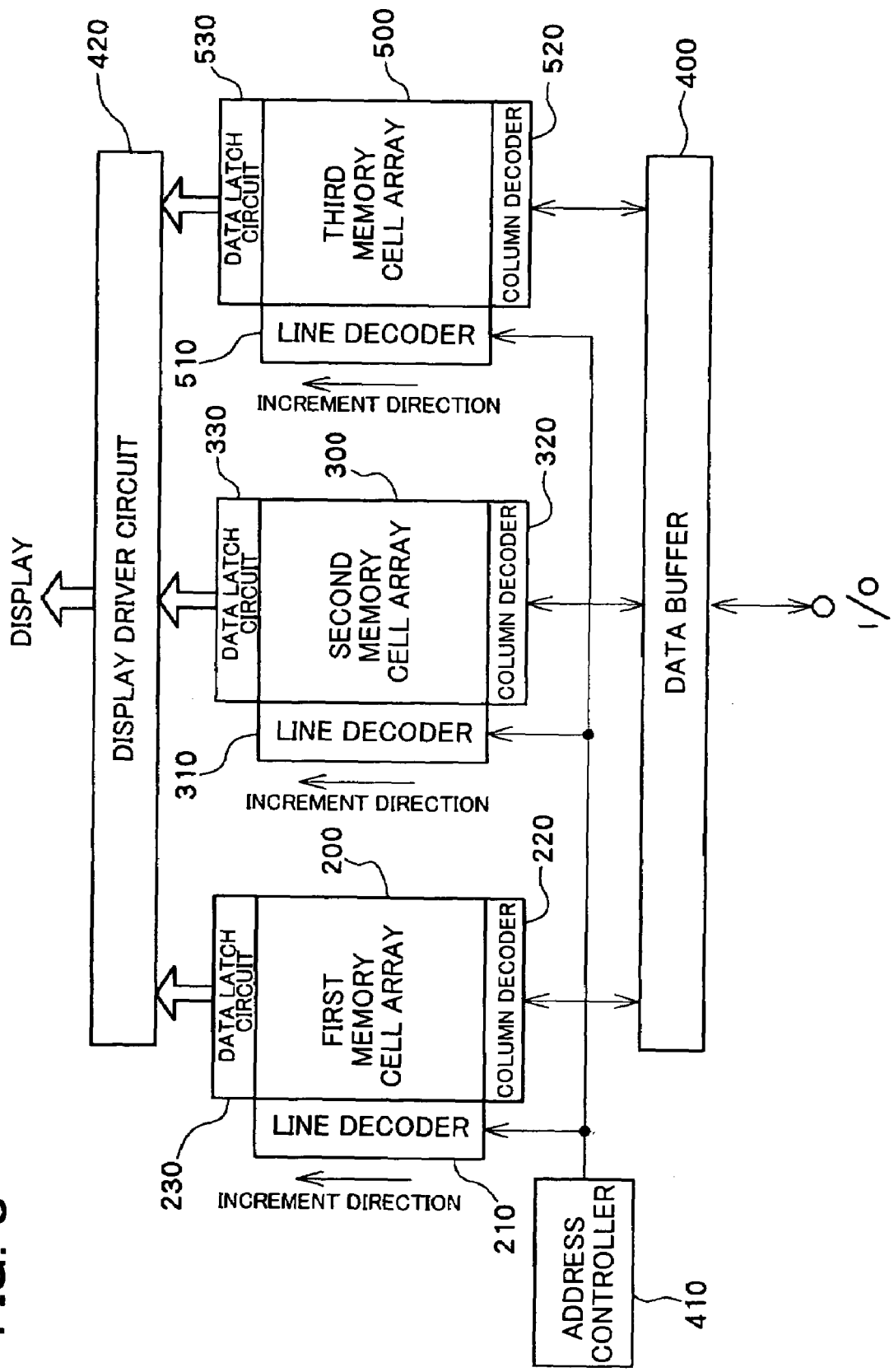
FIG. 8 is a diagram schematically showing a ferroelectric memory device according to a third embodiment of the present invention.

FIG. 8 shows a third embodiment of the present invention obtained by adding a third memory cell array 500 to the configuration shown in FIG. 4. A line decoder 510, a column decoder 520, and a data latch circuit 530 are provided as peripheral circuits of the third memory cell array 500.

In the present embodiment, the data buffer 400 rewrites data read from the first memory cell array 200 into the second memory cell array 300 in the same manner as in the second embodiment. The data buffer 400 rewrites data read from the second memory cell array 300 into the third memory cell array 500, and rewrites data read from the third memory cell array 500 into the first memory cell array 200. The first to third memory cell arrays 200, 300, and 500 are used as a memory for one frame in this manner.

Figure 9:
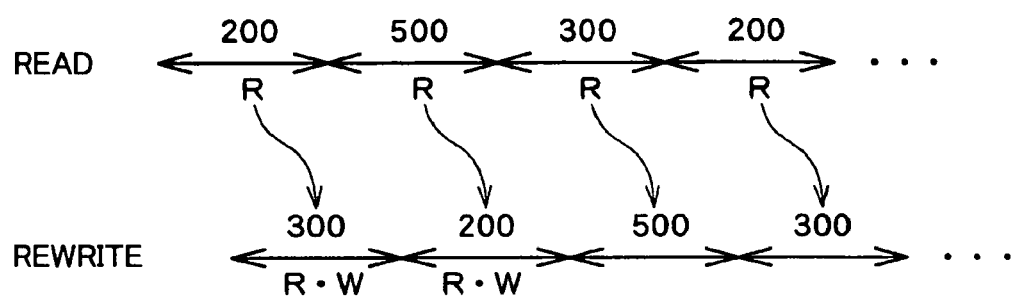
FIG. 9 is a diagram illustrative of a read sequence of the ferroelectric memory device shown in FIG. 8.
Figure 10:
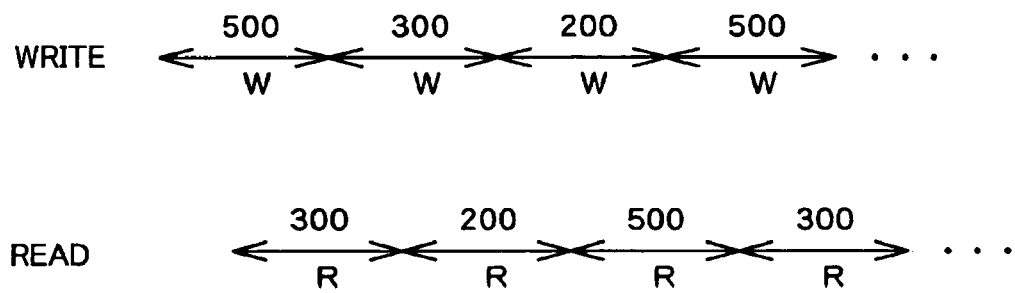
FIG. 10 is a diagram illustrative of a write sequence of the ferroelectric memory device shown in FIG. 8.

FIGS. 9 and 10 respectively show a read sequence and a write sequence of the device shown in FIG. 8. In FIGS. 9 and 10, the read operation is necessarily performed for the memory cell array in which data is written (rewritten) before writing, whereby the data "0" has been written therein.

The present invention is not limited to the above-described embodiments. Various modifications and variations are possible within the spirit and scope of the present invention. In the second embodiment, a plurality of the second memory cell arrays 300 may be disposed for one first memory cell array 200, for example. In this case, the memory cell arrays 300 and 500 illustrated in the third embodiment may be used as the second memory cell arrays. The data read from the first memory cell array 100 may be rewritten into the second memory cell arrays 300 and 500. During a period in which the data is read from the second memory cell array 300, new data may be rewritten into the second memory cell array 500. Since the old data read from the second memory cell array 300 is rewritten into the first memory cell array 100 during this period, new data cannot be rewritten into the first memory cell array 100.

Figure 11:
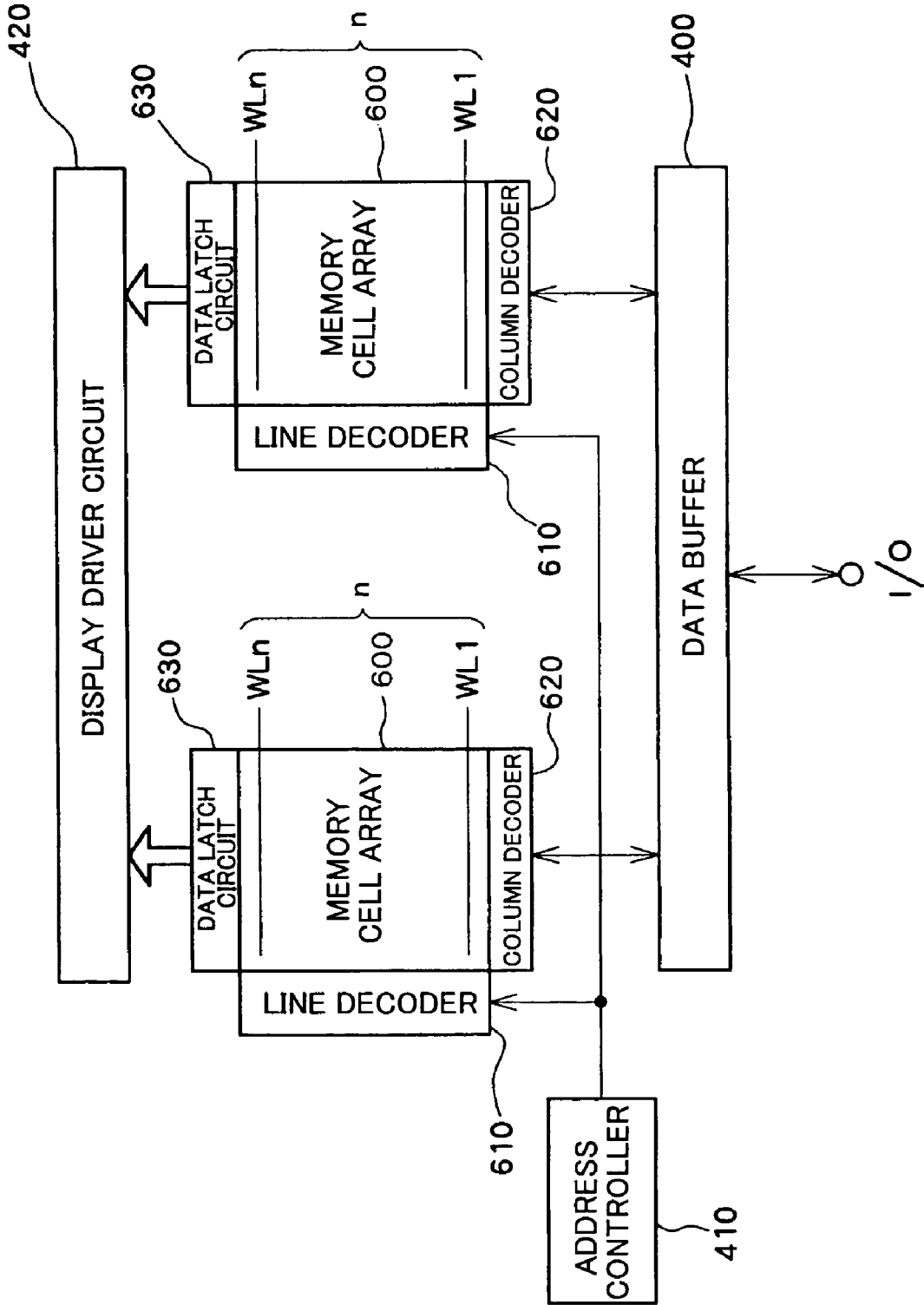
FIG. 11 is a diagram schematically showing a modification of the second embodiment of the present invention.
Figure 12:
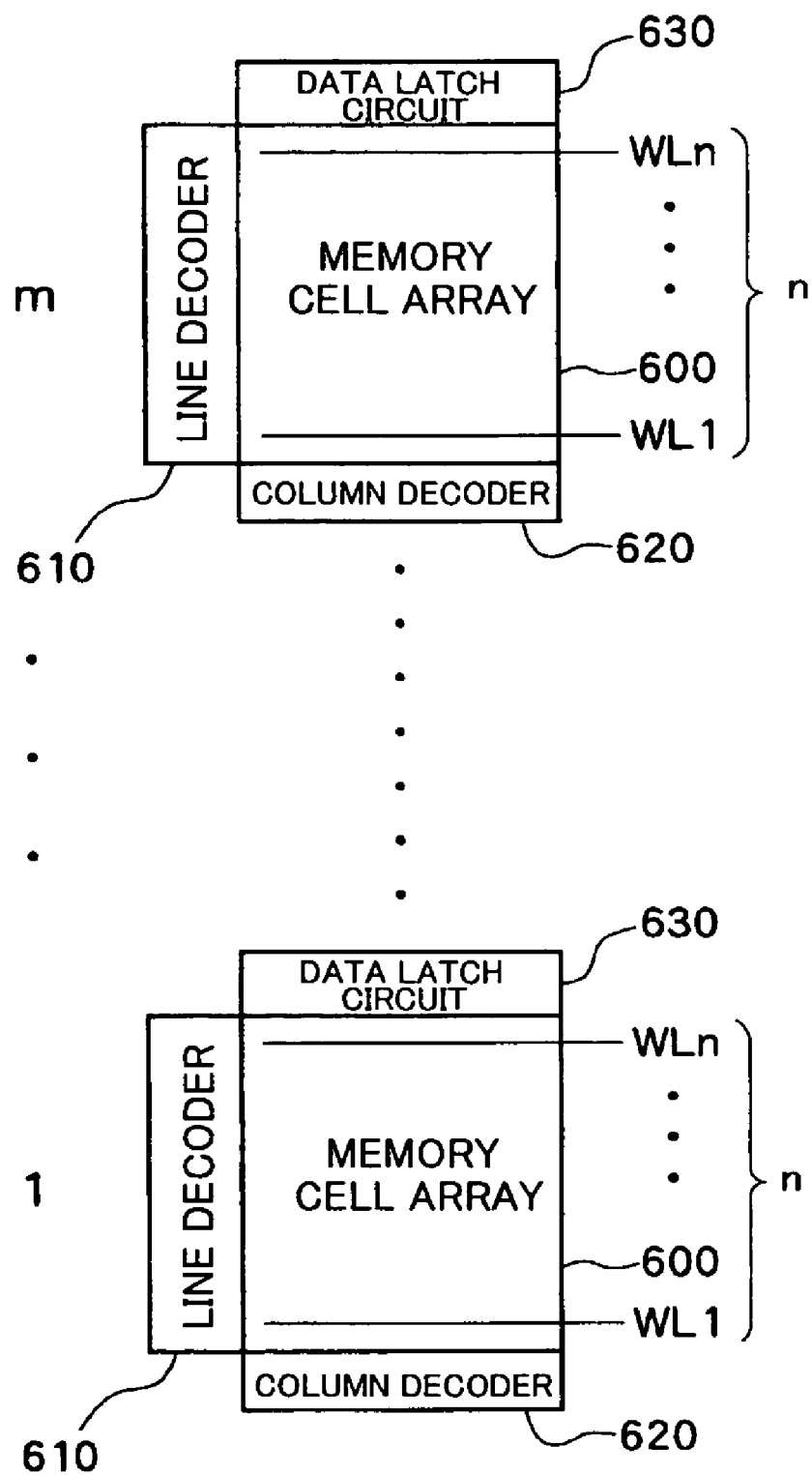
FIG. 12 is a diagram showing memory cell arrays which can be substituted for first to third memory cell arrays shown in FIGS. 4 and 8.

As the memory cell arrays 200, 300, and 500 used in the second and third embodiments, memory cell arrays having the same structure as the memory cell array 100 in the first embodiment are not necessarily used. If the memory cell array 100 illustrated in the first embodiment is used, occurrence of a problem in which two logical values are erroneously judged can be prevented by the function of the hardware. The first and second memory cell arrays 200 and 300 may be formed by using a memory cell array 600 shown in FIG. 11, in which the bitlines are not hierarchized and which includes n wordlines WL1 to WLn corresponding to the above-described limit number about relaxation. The first to third memory cell arrays 200, 300, and 500 may be formed by arranging a plurality of the memory cell arrays 600 as shown in FIG. 12. In this case, each of line decoders 610 is connected with the address controller 410 shown in FIG. 4 or 8, each of column decoders 620 is connected with the data buffer 400 shown in FIG. 4 or 8, and each of data latch circuits 630 is connected with the display driver circuit 420 shown in FIG. 4 or 8.

What is claimed is:

1. A ferroelectric memory device comprising:
   a memory cell array region divided into a plurality of block regions;
   a plurality of wordlines arranged in parallel along a first direction within the memory cell array region;
   a plurality of bitlines arranged in parallel along a second direction intersecting the first direction, within the memory cell array region;
   a plurality of sub-bitlines provided for each of the bitlines in each of the block regions;

a sub-bitline select switch provided between each of the sub-bitlines and corresponding one of the bitlines;

a plurality of ferroelectric memory cells respectively disposed at intersections between the sub-bitlines and the wordlines;

a first driver section which drives the wordlines and the sub-bitline select switches; and a second driver section which drives the bitlines, wherein the first driver section selects one of the wordlines sequentially in the second direction, and turns on the sub-bitline select switches connected to the sub-bitlines intersecting the selected one of the wordlines; and wherein the number of the wordlines in each of the block regions is set equal to or less than a predetermined limit number of times for preventing excessive relaxation of the ferroelectric memory cells.

2. The ferroelectric memory device as defined in claim 1, wherein the predetermined limit number is a maximum number of times an unselected voltage is allowed to be applied when logic of data deteriorated by the repeated application of the unselected voltage with the same polarity to the ferroelectric memory cells, is determined to be the same as the logic of the original data before deterioration by a sense amplifier connected to the bitlines when reading the data.

3. A display driver IC comprising:
the ferroelectric memory device as defined in claim 1; and
a driver section which is driven based on data read from the ferroelectric memory device.

4. A ferroelectric memory device comprising:
a plurality of memory cell array regions;
a plurality of wordlines arranged in parallel along a first direction within each of the memory cell array regions;
a plurality of bitlines arranged in parallel along a second direction intersecting the first direction, within each of the memory cell array regions;
a plurality of ferroelectric memory cells respectively disposed at intersections between the wordlines and the bitlines within each of the memory cell array regions;
a first driver section which drives the wordlines within each of the memory cell array regions; and
a second driver section which drives the bitlines within each of the memory cell array regions,
wherein the memory cell array regions are arranged along the second direction, and the first driver section selects one of the wordlines sequentially in the second direction within each of the memory cell array regions; and
wherein the number of the wordlines within each of the memory cell array regions is set equal to or less than a predetermined limit number of times for preventing excessive relaxation of the ferroelectric memory cells.

5. The ferroelectric memory device as defined in claim 4, wherein the predetermined limit number is a maximum number of times an unselected voltage is allowed to be applied when logic of data deteriorated by the repeated application of the unselected voltage with the same polarity to the ferroelectric memory cells, is determined to be the same as the logic of the original data before deterioration by a sense amplifier connected to the bitlines when reading the data.

6. A display driver IC comprising:
the ferroelectric memory device as defined in claim 4; and
a driver section which is driven based on data read from the ferroelectric memory device.

7. A ferroelectric memory device comprising:
a first memory cell array;
a second memory cell array; and
a data buffer which writes data read from the first memory cell array into the second memory cell array;
wherein each of the first and second memory cell arrays includes:
a plurality of wordlines arranged in parallel along a first direction and sequentially selected in a second direction which intersects the first direction;
a plurality of wordlines arranged in parallel along a first direction and sequentially selected in a second direction which intersects the first direction;
a plurality of bitlines arranged in parallel along the second direction and connected to the data buffer; and
a plurality of ferroelectric memory cells respectively disposed at intersections between the wordlines and the bitlines;
wherein at least one of the ferroelectric memory cells connected to one of the wordlines within the first memory cell array is set into a state in which a first logical value is written by reading one of the first logical value and a second logical value stored in the at least one of the ferroelectric memory cells; and wherein the second logical value read from the first memory cell array is written into at least one of the ferroelectric memory cells connected to one of the wordlines within the second memory cell array, the first logical value being previously stored in the at least one of the ferroelectric memory cells.

8. The ferroelectric memory device as defined in claim 7, wherein the data buffer writes data read from the second memory cell array into the first memory cell array.

9. The ferroelectric memory device as defined in claim 7, wherein at least one of the ferroelectric memory cells connected to one of the wordlines within one of the first and second memory cell arrays is set into a state in which a first logical value is written by reading one of the first logical value and a second logical value stored in the at least one of the ferroelectric memory cells; and wherein the second logical value read from one of the first and second memory cell arrays is written into at least one of the ferroelectric memory cells connected to one of the wordlines within the other of the first and second memory cell arrays, the first logical value being previously stored in the at least one of the ferroelectric memory cells.

10. The ferroelectric memory device as defined in claim 7,
wherein each of the first and second memory cell arrays is divided into a plurality of block regions;
wherein each of the first and second memory cell arrays further includes:
a plurality of sub-bitlines provided for each of the bitlines in each of the block regions; and
a sub-bitline select switch provided between each of the sub-bitlines and corresponding one of the bitlines;
wherein the ferroelectric memory cells are respectively disposed also at intersections between the sub-bitlines and the wordlines; and
wherein the number of the wordlines in each of the block regions is set equal to or less than a predetermined limit number of times for preventing excessive relaxation of the ferroelectric memory cells.

11. The ferroelectric memory device as defined in claim 7, further comprising:

a third memory cell array which includes a plurality of wordlines, a plurality of bitlines, and a plurality of ferroelectric memory cells, wherein the data buffer writes data read from the second memory cell array into the third memory cell array, and writes data read from the third memory cell array into the first memory cell array.

12. The ferroelectric memory device as defined in claim 11, wherein at least one of the ferroelectric memory cells connected to one of the wordlines within one of the first to third memory cell arrays is set into a state in which a first logical value is written by reading one of the first logical value and a second logical value stored in the at least one of the ferroelectric memory cells; and wherein the second logical value read from one of the first to third memory cell arrays is written into at least one of the ferroelectric memory cells connected to one of the wordlines within another one of the first to third memory cell arrays, the first logical value is previously stored in the at least one of the ferroelectric memory cells.

13. The ferroelectric memory device as defined in claim 11, wherein each of the first to third memory cell arrays is divided into a plurality of block regions;

wherein each of the first to third memory cell arrays further includes:

a plurality of sub-bitlines provided for each of the bitlines in each of the block regions; and a sub-bitline select switch provided between each of the sub-bitlines and corresponding one of the bitlines;

wherein the ferroelectric memory cells are respectively disposed also at intersections between the sub-bitlines and the wordlines; and wherein the number of the wordlines in each of the block regions is set equal to or less than a predetermined limit number of times for preventing excessive relaxation of the ferroelectric memory cells.

14. A display driver IC comprising:

the ferroelectric memory device as defined in claim 7; and a driver section which is driven based on data read from the ferroelectric memory device.

* * * * *